United States Patent
Kim et al.

(10) Patent No.: US 8,088,302 B2
(45) Date of Patent: *Jan. 3, 2012

(54) GREEN PHOSPHOR OF THIOGALLATE, RED PHOSPHOR OF ALKALINE EARTH SULFIDE AND WHITE LIGHT EMITTING DEVICE THEREOF

(75) Inventors: Kyung Nam Kim, Seoul (KR); Sang Mi Park, Seoul (KR); Tomizo Matsuoka, Seoul (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 589 days.

This patent is subject to a terminal disclaimer.

(21) Appl. No.: 11/912,383

(22) PCT Filed: May 23, 2006

(86) PCT No.: PCT/KR2006/001921
§ 371 (c)(1),
(2), (4) Date: Oct. 23, 2007

(87) PCT Pub. No.: WO2006/126817
PCT Pub. Date: Nov. 30, 2006

(65) Prior Publication Data
US 2008/0191228 A1    Aug. 14, 2008

(51) Int. Cl.
*H01L 33/00* (2010.01)
*C09K 11/80* (2006.01)

(52) U.S. Cl. .................. 252/301.4 S; 257/98; 313/503; 313/486; 313/487

(58) Field of Classification Search ............ 252/301.4 S; 313/503, 486, 487; 257/98
See application file for complete search history.

(56) References Cited

U.S. PATENT DOCUMENTS

| 2,110,162 | A | 3/1938 | Leverenz |
| 2,402,760 | A | 6/1946 | Leverenz |
| 3,639,254 | A | 2/1972 | Peters |
| 4,065,688 | A | 12/1977 | Thornton |
| 4,303,913 | A | 12/1981 | Nitta |
| 4,563,297 | A | 1/1986 | Kukimoto |
| 5,208,462 | A | 5/1993 | O'Connor |

(Continued)

FOREIGN PATENT DOCUMENTS

CN       1584703       2/2005

(Continued)

OTHER PUBLICATIONS

Philippot et al, "relataion Between Properties and Structural Evolution of Some Si, Ge, Sn Ternary Chalogenides", React. Solids {Proc. Int. Symp.}$8^{th}$ Meeting, 1976, pp. 535-539.*

(Continued)

*Primary Examiner* — Carol M Koslow
(74) *Attorney, Agent, or Firm* — H.C. Park & Associates, PLC

(57) ABSTRACT

The present invention relates to a white light emitting device in which a thiogallate based phosphor capable of emitting green light and an alkaline earth metal sulfide based phosphor capable of emitting red light are arranged on an upper surface of a light emitting diode for emitting ultraviolet rays or blue light such that the mixing of the lights can result in white light with high brightness, and thus, excellent white light with high color purity and color reproducibility after color filtration.

9 Claims, 2 Drawing Sheets

U.S. PATENT DOCUMENTS

| | | | |
|---|---|---|---|
| 5,598,059 | A | 1/1997 | Sun |
| 5,656,888 | A | 8/1997 | Sun et al. |
| 5,834,053 | A | 11/1998 | Dye et al. |
| 6,252,254 | B1 * | 6/2001 | Soules et al. ............... 257/89 |
| 6,417,019 | B1 | 7/2002 | Mueller et al. |
| 6,501,102 | B2 | 12/2002 | Mueller-Mach et al. |
| 6,521,915 | B2 | 2/2003 | Odaki et al. |
| 6,617,782 | B2 | 9/2003 | Cheong et al. |
| 6,680,569 | B2 | 1/2004 | Mueller-Mach et al. |
| 6,686,691 | B1 | 2/2004 | Mueller et al. |
| 6,695,982 | B2 | 2/2004 | Ellens et al. |
| 6,762,551 | B2 * | 7/2004 | Shiiki et al. ............... 313/503 |
| 6,783,700 | B2 | 8/2004 | Tian et al. |
| 6,809,347 | B2 | 10/2004 | Tasch et al. |
| 6,943,380 | B2 | 9/2005 | Ota et al. |
| 7,011,896 | B2 | 3/2006 | Yano et al. |
| 7,468,147 | B2 | 12/2008 | Shida et al. |
| 7,482,636 | B2 | 1/2009 | Murayama et al. |
| 7,608,200 | B2 | 10/2009 | Seto et al. |
| 2003/0020101 | A1 | 1/2003 | Bogner et al. |
| 2003/0076669 | A1 | 4/2003 | Itoh et al. |
| 2003/0228412 | A1 | 12/2003 | Chen |
| 2004/0051111 | A1 | 3/2004 | Ota et al. |
| 2004/0104391 | A1 | 6/2004 | Maeda et al. |
| 2004/0124758 | A1 | 7/2004 | Danielson et al. |
| 2005/0046334 | A1 | 3/2005 | Fujiwara |
| 2005/0123243 | A1 | 6/2005 | Steckl et al. |
| 2005/0135118 | A1 | 6/2005 | Takata |
| 2005/0224828 | A1 | 10/2005 | Oon et al. |
| 2005/0236958 | A1 | 10/2005 | Wang et al. |
| 2005/0254258 | A1 | 11/2005 | Lee |
| 2005/0276074 | A1 | 12/2005 | Ryu |
| 2006/0081862 | A1 | 4/2006 | Chua et al. |
| 2006/0082296 | A1 | 4/2006 | Chua et al. |
| 2007/0090381 | A1 | 4/2007 | Otsuka et al. |
| 2007/0221938 | A1 | 9/2007 | Radkov et al. |
| 2007/0259206 | A1 | 11/2007 | Oshio |
| 2009/0066230 | A1 | 3/2009 | Hirosaki et al. |
| 2009/0218581 | A1 | 9/2009 | Schmidt et al. |
| 2009/0295272 | A1 | 12/2009 | Oshio |

FOREIGN PATENT DOCUMENTS

| | | |
|---|---|---|
| DE | 10028266 | 12/2001 |
| JP | 57-128772 | 8/1982 |
| JP | 2927279 | 5/1999 |
| JP | 2000-171796 | 6/2000 |
| JP | 2002-060747 | 2/2002 |
| JP | 2002-156531 | 5/2002 |
| JP | 2002-531956 | 9/2002 |
| JP | 2003-203504 | 7/2003 |
| JP | 2003-315796 | 11/2003 |
| JP | 2004-094031 | 3/2004 |
| JP | 2004-119375 | 4/2004 |
| JP | 2004-119743 | 4/2004 |
| JP | 2004-161807 | 6/2004 |
| JP | 2004-296830 | 10/2004 |
| JP | 2004-327492 | 11/2004 |
| JP | 2005-019997 | 1/2005 |
| JP | 2005-079500 | 3/2005 |
| KR | 10-2001-0089508 | 10/2001 |
| KR | 10-2001-0097147 | 11/2001 |
| KR | 10-2001-0101761 | 11/2001 |
| KR | 10-2002-0027538 | 4/2002 |
| KR | 10-2002-0067818 | 8/2002 |
| KR | 10-2004-0000004 | 1/2004 |
| KR | 10-2004-0088418 | 10/2004 |
| KR | 10-2005-0117165 | 12/2005 |
| KR | 10-2006-0028932 | 4/2006 |
| KR | 10-2006-0063586 | 6/2006 |
| KR | 10-0601200 | 7/2006 |
| KR | 10-2007-0002385 | 1/2007 |
| KR | 10-0700231 | 3/2007 |
| WO | 98/05078 | 2/1998 |
| WO | 00/33390 | 6/2000 |
| WO | 0124229 | 4/2001 |
| WO | WO 01/24229 * | 4/2001 |
| WO | 02-11173 | 2/2002 |
| WO | 02/098180 | 12/2002 |
| WO | 03/021691 | 3/2003 |
| WO | 03/080763 | 10/2003 |
| WO | 03/081957 | 10/2003 |
| WO | 2003/107441 | 12/2003 |
| WO | 04-007636 | 1/2004 |
| WO | 2005/026285 A2 | 3/2005 |
| WO | 2005/026285 A3 | 3/2005 |
| WO | 2005/068584 | 7/2005 |
| WO | 06-126817 | 11/2006 |

OTHER PUBLICATIONS

TW Preliminary Notice of First Office Action dated Oct. 2, 2009.
Communication with Supplementary European Search Report dated Aug. 4, 2010.
Extended European Search Report of EU 06 71 6411 dated Feb. 16, 2009 corresponding to U.S. Appl. No. 12/293,160.
International Search Report of PCT/KR2006/000961 dated Dec. 11, 2006 corresponding to U.S. Appl. No. 12/293,160.
Chinese Office Action of Chinese Application No. 2006800103321 dated Aug. 29, 2008, corresponding to U.S. Appl. No. 11/909,700.
International Search Report of PCT/KR2006/000885 dated on Jun. 21, 2006, corresponding to U.S. Appl. No. 11/909,700.
Written Opinion of PCT/KR2006/000885 dated on Jun. 21, 2006, corresponding to U.S. Appl. No. 11/909,700.
Non-Final Office Action of U.S. Appl. No. 11/909,700 issued on Jun. 3, 2010.
Notice of Allowance of U.S. Appl. No. 11/909,700 issued on Nov. 30, 2010.
Chinese Office Action dated Feb. 5, 2010 in Chinese Patent App. No. 200680018490.1, corresponding to U.S. Appl. No. 11/912,384.
International Search Report of PCT/KR2006/001923 dated on Aug. 31, 2006, corresponding to U.S. Appl. No. 11/912,384.
Notice of Allowance of U.S. Appl. No. 11/912,384 issued on Feb. 2, 2011.
E. Philippot et al., "Relation Between properties and structural evolution of some Si, Ge Sn Ternary chalogenides", (1997), React, Solids [Proc. Int. Symp.]. 8th, Meeting date 1976, pp. 535-539, corresponding to U.S. Appl. No. 11/913,538.
Baur et al. "White Light Emitting Diodes", (1998), Adv. Solid State Phys., vol. 67, pp. 67-78, corresponding to U.S. Appl. No. 11/913,538.
International Search Report of PCT/KR2006/002330 dated on Oct. 9, 2006, corresponding to U.S. Appl. No. 11/913,538.
Non-Final Office Action of U.S. Appl. No. 11/913,538 issued on Nov. 25, 2008.
Final Office Action of U.S. Appl. No. 11/913,538 issued on Apr. 17, 2009.
Non-Final Office Action of U.S. Appl. No. 11/913,538 issued on Jul. 31, 2009.
Final Office Action of U.S. Appl. No. 11/913,538 issued on Mar. 25, 2010.
Non-Final Office Action of U.S. Appl. No. 12/904,219 issued on Mar. 3, 2011.
Final Office Action of U.S. Appl. No. 11/948,813 issued on Dec. 8, 2010.
Non-Final Office Action of U.S. Appl. No. 111948,813 issued on Aug. 18, 2010.
Non-Final Office Action of U.S. Appl. No. 12/306,664 issued on Feb. 1, 2011.
European Search Report of EP06768577.6 issued on Jan. 20, 2011, corresponding to U.S. Appl. No. 11/912,384.
Notice of Allowance of U.S. Appl. No. 11/912,384 issued on May 11, 2011.
Non-Final Office Action of U.S. Appl. No. 121/293,160 issued on May 23, 2011.
European Search Report dated Apr. 26, 2011 for EP Application No. 11151900.5.

* cited by examiner

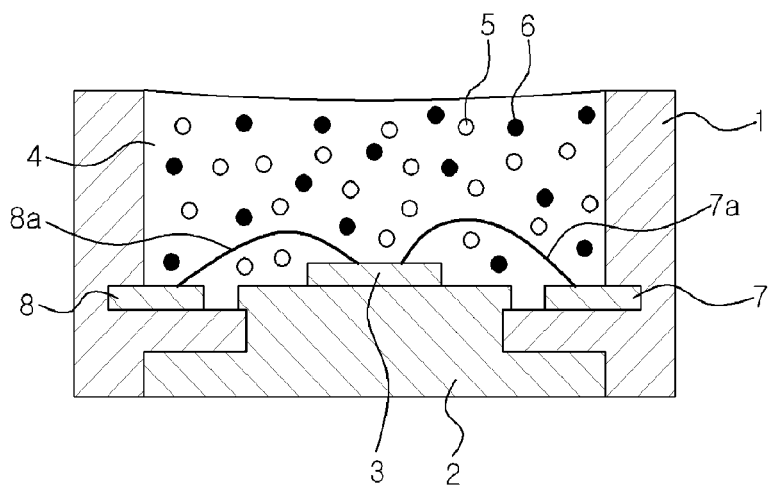
[Fig. 1]
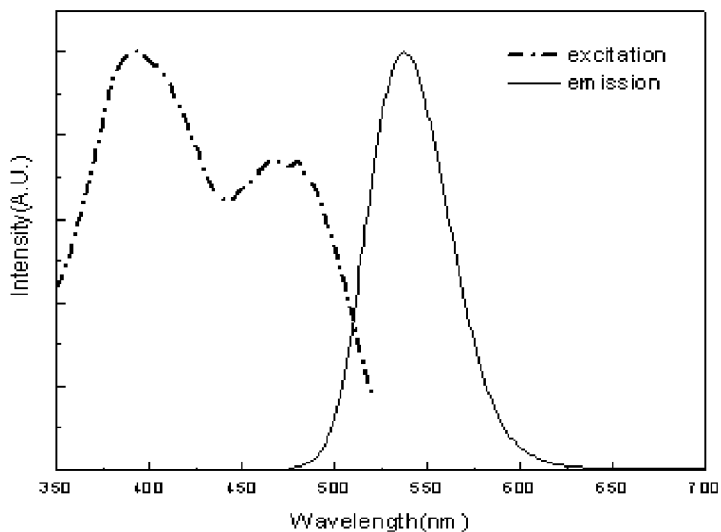
[Fig. 2]
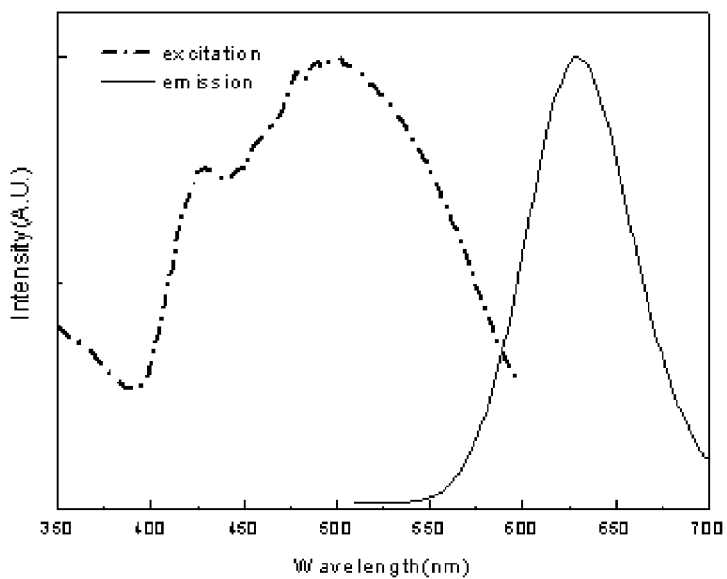
[Fig. 3]

[Fig. 4]
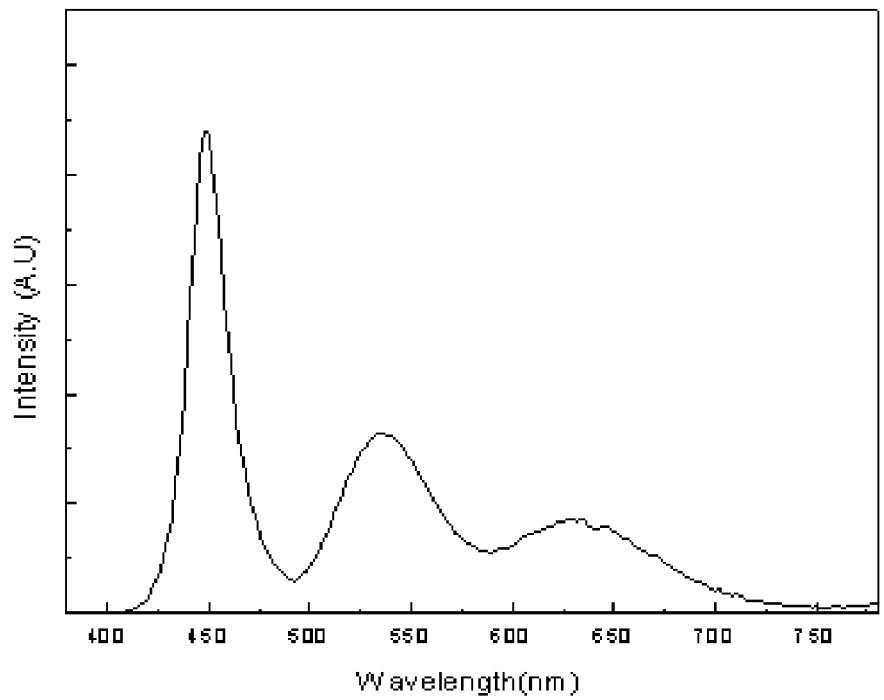
[Fig. 5]
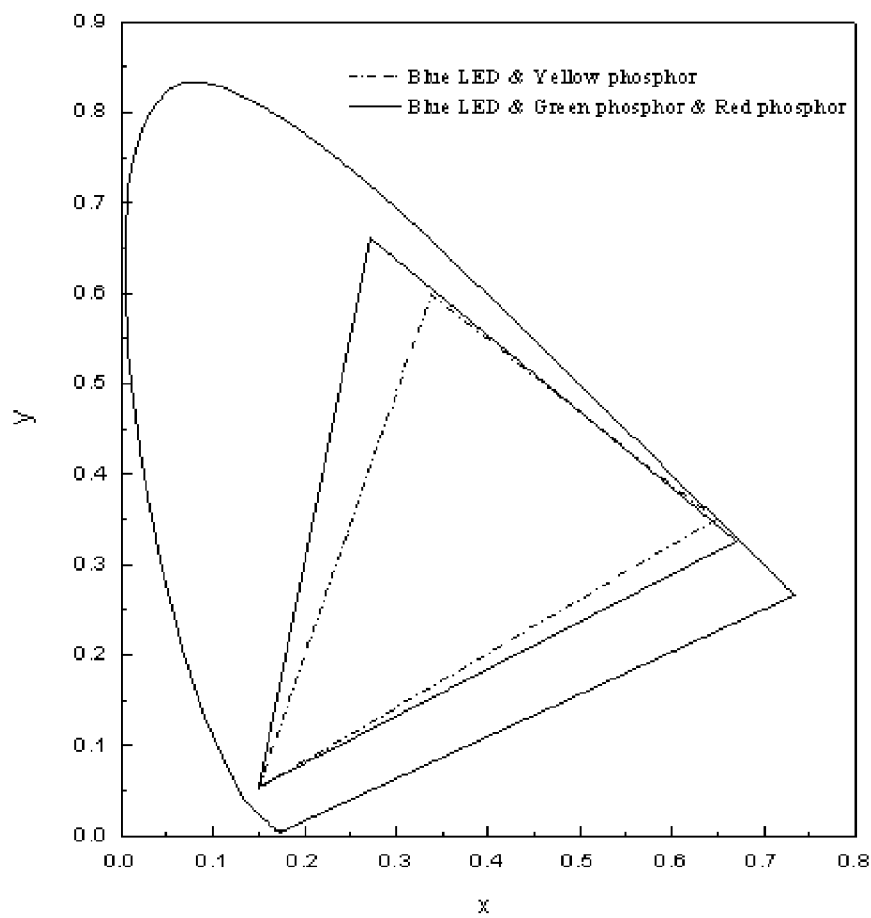

GREEN PHOSPHOR OF THIOGALLATE, RED PHOSPHOR OF ALKALINE EARTH SULFIDE AND WHITE LIGHT EMITTING DEVICE THEREOF

TECHNICAL FIELD

The present invention relates to a phosphor and a light emitting device employing the same. More particularly, the present invention relates to a thiogallate based green phosphor, an alkaline earth metal sulfide based red phosphor and a white light emitting device employing the same, which have improved light emission efficiency.

BACKGROUND ART

White light emitting devices have been widely utilized as a backlight for a liquid crystal display (LCD), which has been used in the lights, notebook computers, mobile phones, personal digital assistants (PDA), etc.

A conventional method of manufacturing a white light emitting device includes a method of coupling YAG:Ce or $(Ba,Sr,Ca)_2SiO_4$:Eu phosphor with a blue light emitting diode and a method of attaching red, green and blue light emitting diodes in a single package such that white light can be emitted by mixing the red, green and blue light with one another.

DISCLOSURE OF INVENTION

Technical Problem

However, since a white light emitting device using a blue light emitting diode generally uses a blue light source with a wavelength range of 450 to 470 nm to excite a yellow phosphor such as YAG:Ce or $(Ba,Sr,Ca)_2SiO_4$:Eu phosphor positioned at an upper layer of the light emitting diode and to emit light thereby and emits white light by mixing the blue and yellow light with each other, there are many problems in the emission of white light suitable for the LCD backlight.

That is, the white light emitting device that has been manufactured by combining the blue light emitting diode having a wavelength range of 450 to 470 nm with the yellow phosphor such as YAG:Ce or $(Ba,Sr,Ca)_2SiO_4$:Eu phosphor causes color reproducibility after color filtration, which is the most important factor among the backlight characteristics, to be deteriorated due to its inherent spectrum shortage of green and red lights.

On the other hand, in order to manufacture a white light emitting device using red, green and blue light emitting diodes, different substrates made of GaAs, AlGaInP, AlInGaN, GaN, etc. should be manufactured to utilize different semiconductor thin films. Thus, there are some problems related to difficulty in manufacturing the light emitting diodes, very complex operation of the light emitting diode as a backlight, and difficulty in mixing lights. Further, there is another problem in that the manufacturing costs are increased.

Technical Solution

Accordingly, an object of the present invention is to provide a thiogallate based green phosphor, an alkaline earth metal sulfide based red phosphor and a white light emitting device employing the same, wherein a single light emitting source can be used to emit white light with high color purity and color reproducibility after color filtration.

According to an aspect of the present invention for achieving the object, there is provided a thiogallate based green phosphor having a general formula of $(A_{1-x-y}Eu_x(M^I_{0.5}M^{III}_{0.5})_y)B_2S_4$, wherein $x+y<1$; A is at least one element selected from the group consisting of Ba, Sr and Ca; B is at least one element selected from the group consisting of Al, Ga and In; x is set within a range of 0.01 to 0.1; $M^I$ is at least one element selected from the group consisting of Li, Na and K; $M^{III}$ is at least one element selected from the group consisting of Sc, Y, Lu, Gd and La; and y is set within a range of $0<y<1$.

According to another aspect of the present invention, there is provided an alkaline earth metal sulfide based red phosphor having a general formula of $A_{x-a}Eu_aGeS_z$, wherein A is at least one element selected from the group consisting of Ca and Sr; $z=x+2$; x is set within a range of 2 to 5; and a/x is set within a range of 0.0005 to 0.02.

According to a further aspect of the present invention, there is provided a white light emitting device, comprising a light emitting diode for emitting blue light; a thiogallate based green phosphor installed above the light emitting diode and excited by the light emitted from the light emitting diode to emit green light; and an alkaline earth metal sulfide based red phosphor installed above the light emitting diode and excited by the light emitted from the light emitting diode to emit red light; such that the green light and the red light are mixed with a portion of the blue light emitted from the light emitting diode to emit white light.

Preferably, the white light emitting device further comprises an ultraviolet light emitting diode for emitting ultraviolet rays. In such a case, at least one of the green and red phosphors may be excited by the light emitted from the ultraviolet light emitting diode to emit relevant light.

Preferably, the white light emitting device further comprises a light-transmitting molding material. In such a case, the thiogallate based green phosphor and the alkaline earth metal sulfide based red phosphor may be dispersed in the light-transmitting molding material.

Preferably, the thiogallate based green phosphor has a general formula of $(A_{1-x-y}Eu_x(M^I_{0.5}M^{III}_{0.5})_y)B_2S_4$, wherein $x+y<1$; A is at least one element selected from the group consisting of Ba, Sr and Ca; B is at least one element selected from the group consisting of Al, Ga and In; x is set within a range of 0.01 to 0.1; $M^I$ is at least one element selected from the group consisting of Li, Na and K; $M^{III}$ is at least one element selected from the group consisting of Sc, Y, Lu, Gd and La; and y is set within a range of $0<y<1$.

Preferably, the alkaline earth metal sulfide based red phosphor has a general formula of $A_{x-a}Eu_aGeS_z$, wherein A is at least one element selected from the group consisting of Ca and Sr; $z=x+2$; x is set within a range of 2 to 5; and a/x is set within a range of 0.0005 to 0.02.

Preferably, the alkaline earth metal sulfide based red phosphor has a general formula of $(Ca,Sr)_{1-x-y}Eu_xD_y(S_{1-z}Se_z)$, where D is at least one element selected from the group consisting of Mn and Pb; x is set within a range of 0.0005 to 0.1; y is set within a range of 0 to 0.5; and z is set within a range of 0 to 1.

More preferably, the alkaline earth metal sulfide based phosphor has a general formula of $(Ca,Sr)_{1-x-y}Eu_xPb_yS$, wherein x is set within a range of 0.0005 to 0.01; and y is set within a range of 0 to 0.5.

More preferably, the alkaline earth metal sulfide based phosphor emits light with a specific wavelength of 600 to 660 nm depending on a composition thereof.

Accordingly, the white light emitting device of the present invention is obtained by arranging a thiogallate based phosphor capable of emitting green light and an alkaline earth metal sulfide based phosphor capable of emitting red light above a light emitting diode for emitting ultraviolet rays or blue light, so that the mixing of the lights can result in white light with high brightness, and thus, excellent white light with high color purity and color reproducibility after color filtration.

Advantageous Effect

The white light emitting device including the thiogallate based green phosphor and the alkaline earth metal sulfide based red phosphor according to the present invention exhibits very excellent green and red light emissions under the excitation in long wavelength ultraviolet region, particularly, blue light region. Therefore, the present invention can be applied to green, red and white light emitting devices for ultraviolet light emitting diode, bluelagoon, pink and white semiconductor light emitting apparatus for blue light emitting diode, and applications in which long wavelength ultraviolet region and blue light region are used as an energy source.

In particular, white light is implemented by applying green and red phosphors to a single blue light emitting diode, so that it can have color purity with more excellent color reproducibility than that of the white light implemented by means of the blue light emitting diode and the yellow phosphor. Therefore, the problems related to the difficulty in manufacturing the light emitting diode and the manufacturing costs can be significantly solved.

BRIEF DESCRIPTION OF DRAWINGS

FIG. 1 is a sectional view schematically showing the configuration of a white light emitting device according to an embodiment of the present invention.

FIG. 2 is a graph illustrating excitation and emission spectra of a thiogallate based green phosphor used in the white light emitting device according to the embodiment of the present invention.

FIG. 3 is a graph illustrating excitation and emission spectra of an alkaline earth metal sulfide based red phosphor used in the white light emitting device according to the embodiment of the present invention.

FIG. 4 is a graph illustrating an emission spectrum of the white light emitting device employing a thiogallate based green phosphor, an alkaline earth metal sulfide based red phosphor and a blue light emitting diode according to the embodiment of the present invention.

FIG. 5 is a graph illustrating comparison results of color coordinate characteristics between the white light emitting device according to the embodiment of the present invention and the white light emitting device according to the prior art.

BEST MODE FOR CARRYING OUT THE INVENTION

Hereinafter, a preferred embodiment of the present invention will be described in detail with reference to the accompanying drawings.

FIG. 1 is a sectional view schematically showing the configuration of a white light emitting device according to an embodiment of the present invention.

Referring to FIG. 1, the white light emitting device according to the embodiment of the present invention is a reflector-type surface mount white light emitting device, wherein a heat sink 2 is installed to a frame body 1 with a recess formed through injection, pressing or other processing, and a light emitting diode 3 for emitting blue light is installed on the heat sink 2.

Above the light emitting diode 3 in the frame body 1 is formed a light-transmitting molding material 4 containing thiogallate based green phosphors 5 that are excited by the light emitted from the light emitting diode 3 to emit green light and alkaline earth metal sulfide based red phosphors 6 that are excited by the light emitted from the light emitting diode to emit red light, such that the green and red light can be mixed with a portion of light emitted from the light emitting diode 3 to emit white light.

Of course, the thiogallate based green phosphor 5 and the alkaline earth metal sulfide based red phosphor 6 can be directly applied onto the light emitting diode 3 without using the light-transmitting molding material 4.

Herein, an example in which the thiogallate based green phosphor 5 and the alkaline earth metal sulfide based red phosphor 6 are contained in the light-transmitting molding material 4 above the light emitting diode 3 will be described.

The light emitting diode 3 has two electrodes for connection to an external power supply. The electrodes may be positioned on the same side or opposite sides of the light emitting diode 3. The electrodes may be electrically connected to their corresponding lead terminals by using adhesives or fine gold wires.

Herein, anode and cathode leads 8 and 7 positioned to both sides of the frame are connected to the light emitting diode 3 through fine gold wires 8a and 7a, respectively.

The light emitting diode 3 is formed of a GaN, InGaN, AlGaN or AlGaInN based material and emits blue light. Here, a light emitting diode for emitting blue light with a wavelength of 420 to 480 nm is used as the light emitting diode 3.

However, the present invention is not limited thereto but may further include a light emitting diode for emitting not only blue light but also ultraviolet rays with a wavelength of 250 to 410 nm. Only one light emitting diode 3 may be provided, or a plurality of light emitting diodes 3 may be provided if desired.

Herein, the present invention is implemented into a reflector-type surface mount white light emitting device configured in such a manner that the heat sink 2 is fitted into the frame body 1 formed through injection, pressing or other processing to form the recess, the light emitting diode 3 is installed onto the heat sink 2, and the anode and cathode leads, i.e. terminals installed to both sides of the frame, are connected to the light emitting diode 3 through the fine gold wires. However, the present invention may be implemented in various different forms.

As a modified example, the present invention may be implemented into a lead-type white light emitting device configured in such a manner that a dam-shaped recess taking the shape of a reflection cup or a reflection plate is formed on a tip end of a lead frame (not shown), the light emitting diode 3 is installed to the recess, and the anode and cathode leads, i.e. terminals installed to a concave portion of the frame, are connected to the light emitting diode 3 through the fine gold wires.

The lead-type white light emitting device may be implemented in such a manner that the light-transmitting molding material 4 containing the thiogallate based green phosphors 5 and the alkaline earth metal sulfide based red phosphors 6 are filled into the recess including an upper surface of the light emitting diode 3 to be flush with a top surface of the recess, and both the light-transmitting molding material and some portions of the anode and cathode are sealed with a light-transmitting covering material.

As another modified example, the present invention may be implemented into a printed circuit board (PCB) type surface mount white light emitting device configured in such a manner that a recess is formed in a concave portion of the frame formed through injection, pressing or other processing, a light emitting diode is installed to the recess, and the anode and cathode leads, i.e. terminals installed to the concave portion of the frame, are connected to the light emitting diode 3 through the fine gold wires.

The surface mount white light emitting device may be implemented by filling the light-transmitting molding material 4 containing the thiogallate based green phosphors 5 and the alkaline earth metal sulfide based red phosphors 6 into the frame body including the upper surface of the light emitting diode 3 to be flush with the top surface of the frame body 1.

At this time, the light emitting diode 3 may be a GaN, InGaN, or AlGaInN based light emitting diode using a sapphire ($Al_2O_3$) substrate, or a GaN, InGaN, or AlGaInN based light emitting diode using a SiC substrate.

Alternatively, the light emitting diode 3 may be a GaN, InGaN, or AlGaInN based light emitting diode manufactured by using any substrate.

Meanwhile, the thiogallate based green phosphors 5 and the alkaline earth metal sulfide based red phosphors 6 are positioned above the light emitting diode 3 and converts a portion of the light emitted from the light emitting diode 3 into light with a relatively longer wavelength.

At this time, the thiogallate based green phosphors 5 and the alkaline earth metal sulfide based red phosphors 6 are dispersed in the light-transmitting molding material 4.

The light emitting diode 3 is covered with the light-transmitting molding material 4 such that the light emitting diode 3 can be protected from the external environment such as moisture or external force. The light-transmitting molding material 4 may be epoxy or silicone and may be positioned in the frame body 1 as shown in the figure.

Meanwhile, in a case where the light emitting diode 3 emits blue light, blue light emitted from the light emitting diode 3, green light emitted from the thiogallate based green phosphor 5 and red light emitted from the alkaline earth metal sulfide based red phosphor 6 are mixed with one another to become white light such that the white light can be emitted outward.

Specifically, the thiogallate based green phosphor 5 is expressed as a general formula of $(A_{1-x-y}Eu_x(M^I_{0.5}M^{III}_{0.5})_y)B_2S_4$, wherein x+y<1.

Here, A is at least one element selected from the group consisting of Ba, Sr and Ca; and B is at least one element selected from the group consisting of Al, Ga and In.

Further, x is set within a range of 0.01 to 0.1; $M^I$ is at least one element selected from the group consisting of Li, Na and K; $M^{III}$ is at least one element selected from the group consisting of Sc, Y, Lu, Gd and La; and y is set within a range of 0<y<1.

The alkaline earth metal sulfide based red phosphor 6 is expressed as a general formula of $A_{x-a}Eu_aGeS_z$. Here, A is at least one element selected from the group consisting of Ca and Sr. Further, z=x+2; x is set within a range of 2 to 5; and a/x is set within a range of 0.0005 to 0.02.

Such red and green phosphors 5 and 6 are obtained in the following manners. That is, a phosphor raw material and an activator are weighted to have a predetermined mixing ratio in accordance with a desired composition and sufficiently mixed into a uniform composition by using a ball milling process or a mixer such as agate mortar within the alcohol solvent for effective mixing.

Then, the mixture is dried in an oven at a temperature of 100 to 150° C. for 1 to 2 hours. The dried mixture is heat-treated in a high-purity alumina boat at a temperature of 800 to 1300° C. under the atmosphere of $H_2S$ using an electric furnace to synthesize phosphor powder and then sufficiently pulverize the synthesized phosphor powder.

According to the results of measuring photoluminescence (PL) of the powder, the thiogallate based green phosphor of a typical composition expressed as a formula $Sr_{0.36}Eu_{0.04}Y_{0.3}Li_{0.3}Ga_2S_4$ exhibits a strong emission spectrum throughout a region of 470 to 630 nm while the alkaline earth metal sulfide based red phosphor expressed as a formula $Sr_{2.185}Eu_{0.015}Ca_{0.8}GeS_5$ exhibits a strong emission spectrum throughout a region of 520 to 780 nm.

When manufacturing the white light emitting device, the aforementioned thiogallate based green phosphors 5 and alkaline earth metal sulfide based red phosphors 6 are contained in the light-transmitting molding material such that the molding material containing the green and red phosphors can be filled into the frame body 1 including the upper surface of the light emitting diode 3.

As such, the light emitting diode 3 made of a gallium nitride (AlInGaN) based compound semiconductor device capable of emitting blue light or ultraviolet rays is combined with the thiogallate based green phosphor 5 and the alkaline earth metal sulfide based red phosphor 6, so that the blue light emission from the light emitting diode 3 can be mixed with the green light emission from the thiogallate based green phosphor 5 and the red light emission from the alkaline earth metal sulfide based red phosphor 6, both of which are excited by the blue light emission, to emit the white light.

FIG. 2 is a graph illustrating excitation and emission spectra of the thiogallate based green phosphor used in the white light emitting device according to the embodiment of the present invention.

Referring to FIG. 2, the thiogallate based green phosphor has an excitation spectrum with a high excitation peak at a wavelength range of 350 to 500 nm and an excellent emission spectrum with a maximum peak at a wavelength of 535 nm.

FIG. 3 is a graph illustrating excitation and emission spectra of the alkaline earth metal sulfide based red phosphor used in the white light emitting device according to the embodiment of the present invention.

Referring to FIG. 3, the alkaline earth metal sulfide based red phosphor used in the white light emitting device according to the embodiment of the present invention has an absorption spectrum with a high excitation peak at a wavelength range of 400 to 550 nm and an excellent emission spectrum with a maximum peak at a wavelength of 630 nm.

FIG. 4 is a graph illustrating an emission spectrum of the white light emitting device employing the thiogallate based green phosphor, the alkaline earth metal sulfide based red phosphor and the blue light emitting diode according to the embodiment of the present invention.

Referring to FIG. 4, it can be understood that reference light emitted from the blue light emitting diode is mixed with the secondary green and red light emitted from the phosphors, by which a portion of the emitted reference light is excited, to radiate white light.

That is, since white light is implemented by mixing the blue, green and red light with one another, the white light emitting device of the present invention has color purity with excellent color reproducibility after the filtration by color filters in a liquid crystal display (LCD) structure.

Accordingly, in a case where the white light emitting devices according to the embodiment of the present invention are disposed in series or in parallel and employed as an LCD backlight, it can provide excellent color purity as compared with the white light obtained by combining the conventional blue light emitting diode with the YAG:Ce or $(Ba,Sr,Ca)_2SiO_4$:Eu yellow light emitting phosphor.

FIG. 5 is a graph illustrating comparison results of color coordinate characteristics between the white light emitting device according to the present invention and the white light emitting device according to the prior art.

Color reproduction ranges, which can be implemented by the white light from the white light emitting device according to the present invention and the white light from the conventional white light emitting device after transmitting through the same color filters, are illustrated as the color coordinates.

Referring to FIG. 5, it can be understood that the color reproduction range of the white light emitting device in which the blue light emitting diode is combined with the thiogallate based green phosphor and the alkaline earth metal sulfide based red phosphor according to the present invention is much greater than that of the white light emitting device in which a blue light emitting diode and $(Ba,Sr,Ca)_2SiO_4$:Eu yellow phosphor is are used according to the prior art.

It is noted that the number of colors that can be expressed is increased as the range of color coordinate becomes greater in the white light emitting diode. Thus, the color expression can be implemented close to the natural color.

The present invention has been illustrated with reference to the preferred embodiment and a plurality of specific modified examples. However, it can be easily understood to those skilled in the art that other embodiments different from the illustrated embodiment and modified examples are included within the scope and spirit of the present invention.

For example, according to one embodiment of the present invention, it has been described that a white light emitting device comprises a light emitting diode for emitting blue light, and thiogallate and alkaline earth metal sulfide based phosphors, which are installed above the light emitting diode and excited by the blue light emitted from the light emitting diode to be able to emit green and red light, respectively.

However, the thiogallate based green phosphor and the alkaline earth metal sulfide based red phosphor according to the present invention may be excited by ultraviolet rays as well as the blue light to exhibit excellent green and red emission.

Accordingly, if an ultraviolet light emitting diode for emitting ultraviolet rays is added to the white light emitting device together with a light emitting diode for emitting blue light, the thiogallate based phosphor and the alkaline earth metal sulfide based phosphor may be excited even by the ultraviolet rays emitted from the ultraviolet light emitting diode to exhibit more excellent green and red emission.

According to another embodiment of the present invention, the thiogallate based green phosphor capable of emitting green light and the alkaline earth metal sulfide based red phosphor capable of emitting red light are disposed above the light emitting diode for emitting blue light. In such a case, the alkaline earth metal sulfide based red phosphor has a general formula of $A_{x-a}Eu_aGeS_z$, wherein A is at least one element selected from the group consisting of Ca and Sr, z=x+2, x is set within a range of 2 to 5, and a/x is set within a range of 0.0005 to 0.02.

However, as another modified example of the preferred embodiment of the present invention, the alkaline earth metal sulfide based red phosphor may have a general formula of $(Ca,Sr)_{1-x-y}Eu_xD_y(S_{1-z}Se_z)$.

In such a case, D is at least one element selected from the group consisting of Mn and Pb. Further, x is set within a range of 0.0005 to 0.1, and y is set within a range of 0 to 0.5, and z is set within a range of 0 to 1.

As a further modified example, the alkaline earth metal sulfide based phosphor may have a general formula of $(Ca,Sr)_{1-x-y}Eu_xPb_yS$.

In such a case, x is set within a range of 0.0005 to 0.01 and y is set within a range of 0 to 0.5.

As a still further modified example, the alkaline earth metal sulfide based phosphor may have a general formula of $Ca_{0.947}Pb_{0.05}Eu_{0.003}S$. In such a case, the phosphor can emit light with a specific wavelength of 650 nm.

As a still further modified example, the alkaline earth metal sulfide based phosphor may have a general formula of $Ca_{0.447}Sr_{0.5}Pb_{0.05}Eu_{0.003}S$. In such a case, the phosphor may emit light with a specific wavelength of 630 nm.

As a still further modified example, the alkaline earth metal sulfide based phosphor may have a general formula of $Ca_{0.897}Pb_{0.1}Eu_{0.003}S$. In such a case, the phosphor may emit light with a specific wavelength of 648 nm.

As described above, the emission wavelength of the light emitted from the alkaline earth metal sulfide based phosphor can be changed according to the constituent elements and composition of the alkaline earth metal sulfide based phosphor.

The invention claimed is:

1. A thiogallate based green phosphor having a general formula of $(A_{1-x-y}Eu_x(M^I_{0.5}M^{III}_{0.5})_y)B_2S_4$, wherein x+y<1; A is at least one element selected from the group consisting of Ba, Sr and Ca; B is at least one element selected from the group consisting of Al, Ga and In; x is set within a range of 0.01 to 0.1; $M^I$ is at least one element selected from the group consisting of Li, Na and K; $M^{III}$ is at least one element selected from the group consisting of Sc, Y, Lu, Gd and La; and y is set within a range of 0<y<1.

2. An alkaline earth metal sulfide based red phosphor having a general formula of $A_{x-a}Eu_aGeS_z$, wherein A is Ca; z=x+2; x is set within a range of 2 to 5; and a/x is set within a range of 0.0005 to 0.02.

3. A white light emitting device, comprising:
a light emitting diode for emitting blue light;
a thiogallate based green phosphor installed above the light emitting diode and excited by the light emitted from the light emitting diode to emit green light; and
an alkaline earth metal sulfide based red phosphor installed above the light emitting diode and excited by the light emitted from the light emitting diode to emit red light;
such that the green light and the red light are mixed with a portion of the blue light emitted from the light emitting diode to emit white light, and
wherein the thiogallate based green phosphor has a general formula of $(A_{1-x-y}Eu_x(M^I_{0.5}M^{III}_{0.5})_y)B_2S_4$, wherein x+y<1; A is at least one element selected from the group consisting of Ba, Sr and Ca; B is at least one element selected from the group consisting of Al, Ga and In; x is set within a range of 0.01 to 0.1; $M^I$ is at least one element selected from the group consisting of Li, Na and K; $M^{III}$ is at least one element selected from the group consisting of Sc, Y, Lu, Gd and La; and y is set within a range of 0<y<1.

4. The white light emitting device as claimed in claim 3, further comprising an ultraviolet light emitting diode for emitting ultraviolet rays, wherein at least one of the green and red phosphors is excited by the light emitted from the ultraviolet light emitting diode to emit relevant light.

5. The white light emitting device as claimed in claim 3, further comprising a light-transmitting molding material, wherein the thiogallate based green phosphor and the alkaline earth metal sulfide based red phosphor are dispersed in the light-transmitting molding material.

6. The white light emitting device as claimed in claim 3, wherein the alkaline earth metal sulfide based red phosphor has a general formula of $A_{x-a}Eu_aGeS_z$, wherein A is at least one element selected from the group consisting of Ca and Sr; z=x+2; x is set within a range of 2 to 5; and a/x is set within a range of 0.0005 to 0.02.

7. The white light emitting device as claimed in claim 3, wherein the alkaline earth metal sulfide based red phosphor has a general formula of $(Ca,Sr)_{1-x-y}Eu_xD_y(S_{1-z}Se_z)$, wherein D is at least one element selected from the group consisting of Mn and Pb; x is set within a range of 0.0005 to 0.1; y is set within a range of 0 to 0.5; and z is set within a range of 0 to 1.

8. The white light emitting device as claimed in claim 7, wherein the alkaline earth metal sulfide based phosphor has a general formula of $(Ca,Sr)_{1-x-y}Eu_xPb_yS$, wherein x is set within a range of 0.0005 to 0.01; and y is set within a range of 0 to 0.5.

9. The white light emitting device as claimed in claim 7, wherein the alkaline earth metal sulfide based phosphor emits light with a specific wavelength of 600 to 660 nm depending on a composition thereof.

* * * * *

UNITED STATES PATENT AND TRADEMARK OFFICE
CERTIFICATE OF CORRECTION

| | |
|---|---|
| PATENT NO. | : 8,088,302 B2 |
| APPLICATION NO. | : 11/912383 |
| DATED | : January 3, 2012 |
| INVENTOR(S) | : Kyung Nam Kim et al. |

Page 1 of 1

It is certified that error appears in the above-identified patent and that said Letters Patent is hereby corrected as shown below:

On the Title page between Item (65) and Item (51), please insert:

Item -- (30)   Foreign Application Priority Data

May 24, 2005    (KR)..................10-2005-0043785
June 30, 2005   (KR)..................10-2005-0057892 --

Signed and Sealed this
Twenty-eighth Day of August, 2012

David J. Kappos
*Director of the United States Patent and Trademark Office*